United States Patent
Ma et al.

(10) Patent No.: US 9,337,622 B2
(45) Date of Patent: May 10, 2016

(54) COMPACT DISTRIBUTED BRAGG REFLECTORS

(71) Applicant: Wisconsin Alumni Research Foundation, Madison, WI (US)

(72) Inventors: Zhenqiang Ma, Middleton, WI (US); Jung-Hun Seo, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 14/334,770

(22) Filed: Jul. 18, 2014

(65) Prior Publication Data

US 2016/0020582 A1    Jan. 21, 2016

(51) Int. Cl.
| | |
|---|---|
| *H01L 33/00* | (2010.01) |
| *H01S 5/187* | (2006.01) |
| *H01S 5/42* | (2006.01) |
| *H01S 5/183* | (2006.01) |
| *H01S 5/042* | (2006.01) |

(52) U.S. Cl.
CPC ............. *H01S 5/187* (2013.01); *H01S 5/042* (2013.01); *H01S 5/183* (2013.01); *H01S 5/423* (2013.01)

(58) Field of Classification Search
CPC . H01L 25/0756; H01L 33/46; H01L 31/1824; H01L 21/76254; H01L 31/0236; H01L 31/02363; H01L 31/03687; H01L 31/056; H01L 31/076; H01L 31/1816; H01L 33/0079; H01L 33/10; H01S 5/183; H01S 5/187; H01S 5/423

USPC .................. 257/98, 431, 79, 88; 438/155
See application file for complete search history.

(56) References Cited

U.S. PATENT DOCUMENTS

| | | | |
|---|---|---|---|
| 5,363,398 A * | 11/1994 | Glass et al. ..................... 372/92 |
| 5,835,521 A | 11/1998 | Ramdani et al. |
| 7,501,303 B2 | 3/2009 | Unlu et al. |
| 2004/0169245 A1* | 9/2004 | Unlu et al. .................... 257/432 |
| 2011/0127549 A1* | 6/2011 | Lee ...................... H01L 27/153 257/88 |
| 2011/0235668 A1* | 9/2011 | Tischler et al. ............ 372/50.11 |

OTHER PUBLICATIONS

Emsley et al., Silicon Substrates With Buried Distributed Bragg Reflectors for Resonant Cavity-Enhanced Optoelectronics, IEEE Journal of Selected Topics in Quantum Electronics, vol. 8, No. 4, Jul. 2002, pp. 948-955.
Akiyama et al., Fabrication of Highly Reflecting Epitaxy-Ready Si—SiO2 Bragg Reflectors, IEEE Photonics Technology Letters, vol. 17, No. 7, Jul. 2005, pp. 1456-1458.
Ishikawa et al., Epitaxy-ready Si/SiO$_2$ Bragg reflectors by multiple separation-by-implanted-oxygen, Applied Physics Letters, vol. 69, No. 25, Dec. 16, 1996, pp. 3881-3883.
Peng et al., Single-crystal silicon/silicon dioxide multilayer heterostructures based on nanomembrane transfer, Applied Physics Letters, vol. 90, May 1, 2007, pp. 183107-1-183107-3.

* cited by examiner

*Primary Examiner* — Duy T Nguyen
(74) *Attorney, Agent, or Firm* — Bell & Manning, LLC

(57) ABSTRACT

Ultra compact DBRs, VCSELs incorporating the DBRs and methods for making the DBRs are provided. The DBRs are composed of a vertical reflector stack comprising a plurality of adjacent layer pairs, wherein each layer pair includes a layer of single-crystalline Group IV semiconductor and an adjacent layer of silicon dioxide.

23 Claims, 17 Drawing Sheets

COMPACT DISTRIBUTED BRAGG REFLECTORS

REFERENCE TO GOVERNMENT RIGHTS

This invention was made with government support under FA9550-09-1-0482 awarded by the USAF/AFOSR. The government has certain rights in the invention.

BACKGROUND

Distributed Bragg Reflectors (DBRs) are used is photodetectors, lasers, solar cells, and other optical sensors. DBRs include multiple layers of alternating materials that have different refractive indices, the thickness of which typically varies from several to several tens of micrometers, depending on the materials. There are several parameters that determine the performance of DBRs, such as refractive index contrast, the roughness of the top surface, and the condition of the interfaces between materials. Epitaxial growth makes it possible to fabricate group III-V semiconductor-based photonic devices, including DBRs, on group III-V material substrates. However, these DBRs typically require many (e.g., >20) layers of material and need to be quite thick (e.g. >10 µm thick) to achieve greater than 90% reflectivity. DBRs constructed from silicon and silicon oxide layers, on the other hand, have a high refractive index contrast, so that they provide high reflection with a more compact structure, compared to DBRs constructed from group III-V materials. DBRs based on pairs of silicon and silicon dioxide ($Si/SiO_2$ DBRs) have been fabricated using chemical vapor deposition (CVD) to deposit polycrystalline (poly-) Si as the silicon layers. (J. C. Bean, J. Qi, C. L. Schow, R. Li, H. Nie, J. Schaub, and J. C. Campbell, "High-speed polysilicon resonant-cavity photodiode with $SiO_2/Si$ Bragg reflectors," *Photonics Technology Letters*, IEEE 9, 806-808 (1997).) However, the roughness of the layer surfaces in such DBRs increases with increasing number of layers. (S. Akiyama, F. J. Grawert, J. Liu, K. Wada, G. K. Celler, L. C. Kimerling, and F. X. Kaertner, "Fabrication of highly reflecting epitaxy-ready $Si—SiO_2$ Bragg reflectors," *Photonics Technology Letters*, IEEE 17, 1456-1458 (2005).) In addition, structural imperfections in the CVD-grown materials, such as local variations in the refractive index, grain boundaries, stacking faults, dislocations, crystallographic twinning, mosaic misorientation, and localized defects, degraded the overall DBR performance by increasing undesirable scattering. (G. Harbeke, "Optical properties of polycrystalline silicon films," in *Polycrystalline Semiconductors* (Springer, 1985), pp. 156-169.) To solve the issues related to interface roughness and post-epitaxial growth, $Si/SiO_2$ DBRs were made using multiple oxygen implantations into a single-crystalline Si substrate at different depths. (Y. Ishikawa, N. Shibata, and S. Fukatsu, "Epitaxy-ready $Si/SiO_2$ Bragg reflectors by multiple separation-by-implanted-oxygen," *Appl. Phys. Lett.* 69, 3881-3883 (1996).) However, limitations on the choice of Si and $SiO_2$ layer thicknesses prevent this method from achieving ideal design parameters since the interface morphology is dependent on the thickness of both layers. A DBR having a single-crystalline top Si layer and polycrystalline lower Si layers has been fabricated using CVD on top of a silicon-on-insulator (SOI) wafer, followed by etching back the entire Si substrate layer and buried oxide layer to expose the top Si layer. (S. Akiyama, F. J. Grawert, J. Liu, K. Wada, G. K. Celler, L. C. Kimerling, and F. X. Kaertner, "Fabrication of highly reflecting epitaxy-ready $Si—SiO_2$ Bragg reflectors," *Photonics Technology Letters*, IEEE 17, 1456-1458 (2005).) This DBR had 7 pairs of $Si/SiO_2$. To reduce the total DBR thickness, DBRs made using a Smart-Cut process have been proposed to insert a single-crystalline Si in each layer pair. (M. K. Emsley, O. Dosunmu, and M. S. Unlu, "Silicon substrates with buried distributed Bragg reflectors for resonant cavity-enhanced optoelectronics," Selected Topics in Quantum Electronics, IEEE Journal of 8, 948-955 (2002).) In addition, DBRs fabricated with transferred single-crystalline silicon layers and amorphous Spin-on-Glass (SOG) silicon oxide ($SiO_x$) layers have been disclosed. (W. Peng, M. M. Roberts, E. P. Nordberg, F. S. Flack, P. E. Colavita, R. J. Hamers, D. E. Savage, M. G. Lagally, and M. A. Eriksson, "Single-crystal silicon/silicon dioxide multilayer heterostructures based on nanomembrane transfer," *Appl. Phys. Lett.* 90, -(2007).) However, it is difficult to precisely control the thickness of an SOG oxide layer and the non-uniform SOG oxide surface left voids at the $Si/SiO_x$ interface after the transfer of the silicon layer. Such voids may affect the DBR performance and the bonding strength between the two layers.

SUMMARY

Ultra compact DBRs, vertical cavity surface emitting lasers (VCSELs) incorporating the DBRs and methods for making the DBRs are provided. Also provided are DBR arrays and VCSEL arrays.

One embodiment of a DBR comprises: a reflector stack comprising at least two adjacent layer pairs, each layer pair comprising: a layer of a single-crystalline Group IV semiconductor, such as silicon or germanium; and an adjacent layer of silicon dioxide. The thickness of the reflector stack may be less than 1.2 µm and in some embodiments is no greater than 1 µm. In some embodiments of the stacks, the rms roughness at the interfaces between the layers of single-crystalline Group IV semiconductor and the layers of silicon dioxide is no greater than 0.5 nm. In an embodiment of a DBR array, a plurality of the DBRs is provided on a substrate, wherein different reflectors in the array are configured to reflect light over different wavelength ranges.

One embodiment of a VCSEL comprises a lower DBR comprising a reflector stack comprising at least two adjacent layer pairs, each layer pair comprising: a layer of a single-crystalline Group IV semiconductor; and an adjacent layer of silicon dioxide; wherein the thickness of the reflector stack is no greater than 1 µm and the rms at the interfaces between the layers of single-crystalline Group IV semiconductor and the layers of silicon dioxide is no greater than 0.5 nm. The VCSEL further comprises an upper DBR comprising a reflector stack comprising least two adjacent layer pairs, each layer pair comprising: a layer of a single-crystalline Group IV semiconductor; and an adjacent layer of silicon dioxide; wherein the thickness of the reflector stack is no greater than 1 µm and the rms roughness at the interfaces between the layers of single-crystalline Group IV semiconductor and the layers of silicon dioxide is no greater than 0.5 nm. The VCSEL further comprises a light-emitting active layer disposed between the lower DBR and the upper DBR. In an embodiment of a VCSEL array, a plurality of the VCSELSs is provided on a substrate, wherein different VCSELs in the array are configured to emit light at different wavelengths when a voltage is applied across the VCSEL.

One embodiment of a method of making a DBR comprises the steps of: growing a first layer of silicon dioxide on a first layer of single-crystalline silicon via thermal oxidation of the single-crystalline silicon; transferring a second layer of single-crystalline silicon onto the first layer of silicon dioxide; growing a second layer of silicon dioxide on the second layer of single-crystalline silicon via thermal oxidation of the single-crystalline silicon; and transferring a third layer of single-crystalline silicon onto the second layer of silicon dioxide.

Another embodiment of a method of making a DBR comprises the steps of: depositing a first layer of silicon dioxide on a first layer of single-crystalline germanium; transferring a second layer of single-crystalline germanium onto the first layer of silicon dioxide; depositing a second layer of silicon dioxide on the second layer of single-crystalline germanium; and transferring a third layer of single-crystalline germanium onto the second layer of silicon dioxide.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Ultra compact DBRs, VCSELs incorporating the DBRs and methods for making the DBRs are provided. The DBRs are composed of a vertical reflector stack comprising a plurality of adjacent layer pairs, wherein each layer pair includes a layer of single-crystalline Group IV semiconductor, such as silicon or germanium, and an adjacent layer of silicon dioxide (a "Si/SiO$_2$" pair or "Ge/SiO$_2$" pair). The single-crystalline silicon layers are incorporated into the stack using a thin film transfer and bonding process, while the SiO$_2$ layers can be thermally grown from the silicon or deposited. These fabrication schemes make it possible to obtain high quality silicon dioxide and precisely controlled and uniform layer thicknesses, which minimizes scattering loss at the interfaces within the reflector stack. As a result, the DBRs can be very thin, with few layer pairs, yet still provide extremely high reflectance. In addition, the transfer and bonding process makes it possible to dispose the DBRs on a wide variety of substrates.

Figure 1:
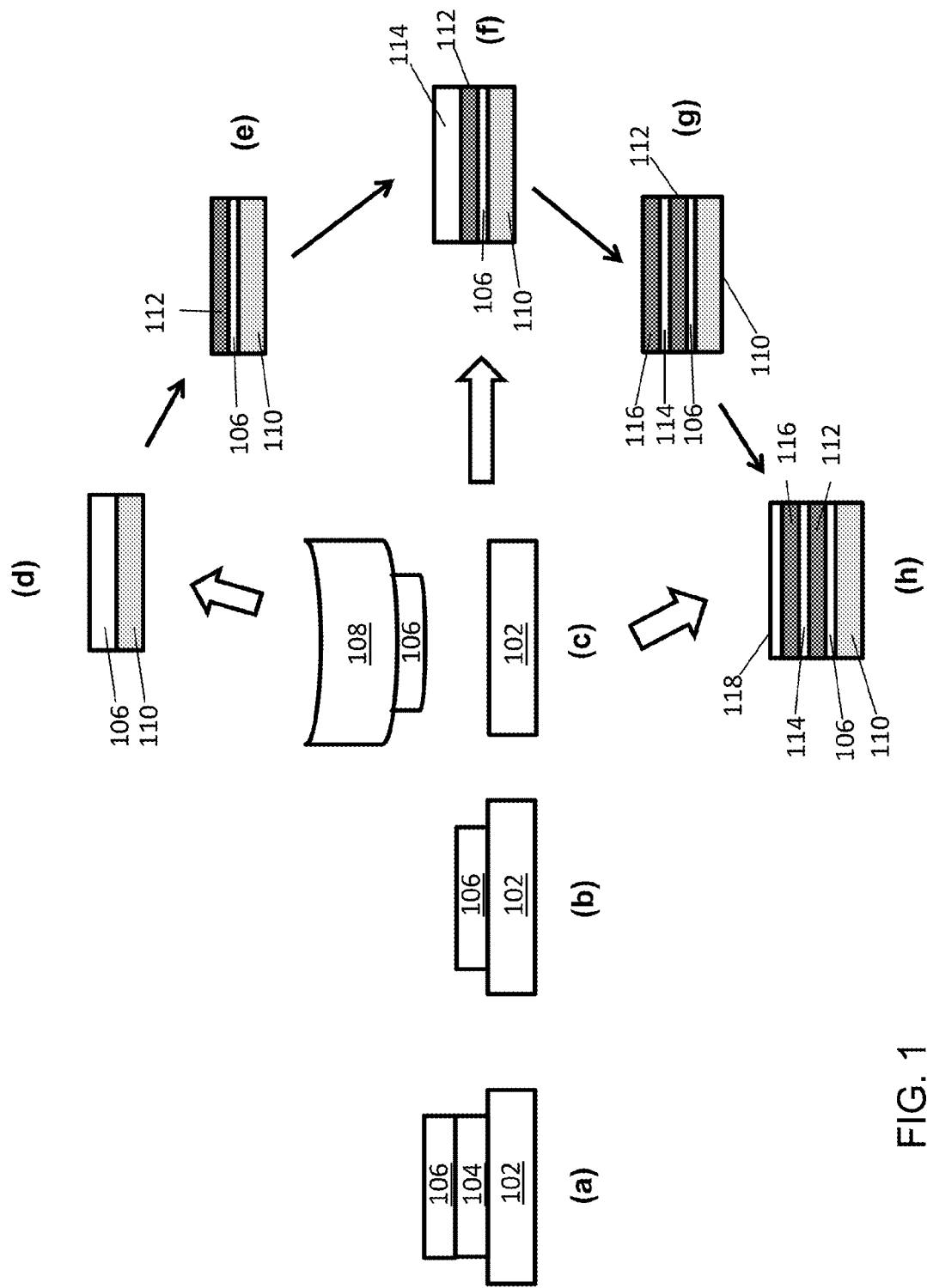
FIG. 1 is a schematic diagram of a transfer and bonding based method of fabricating a DBR composed of 2.5 Si/SiO$_2$ layer pairs.

A method of making a DBR comprising Si/SiO$_2$ pairs is illustrated schematically in FIG. 1. As shown in panel (a), the method begins with an SOI substrate comprising a handle substrate 102, a buried silicon oxide layer 104 and thin layer of single-crystalline silicon 106. SOIs are available commercially. Buried oxide layer 104 is selectively removed from the structure using, for example, a selective chemical etchant. As a result, silicon layer 106 settles onto underlying handle substrate 102, as shown in panel (b). If necessary, the layer of single-crystalline silicon 106 can be thinned using, for example, a polish or etch before it is release from the SOI structure. After silicon layer 106 is released, a host material 108, such as a rubber stamp, is pressed onto the upper surface of silicon layer 106. Silicon layer 106 adheres to host material 108 and is lifted away from handle substrate 102 (panel (c)). In a subsequent step (panel (d)) released single-crystalline silicon layer 106 is brought into contact with, and transferred onto, a support substrate 110. Support substrate 110 may be composed of a material with a high refractive index, such as quartz or silicon. Next, as shown in panel (e), a thin layer of silicon dioxide 112 is grown on transferred single-crystalline silicon layer 106. A second layer pair is then formed on silicon dioxide layer 112 by transferring a second single-crystalline silicon layer 114 onto silicon dioxide layer 112 (panel (f)) and then growing a second silicon dioxide layer 116 on silicon layer 114 via thermal oxidation (panel (g)). In the embodiment shown in FIG. 1, a third layer of single-crystalline silicon 118 is the transferred onto the second layer of silicon dioxide 116 to provide a reflector stack having 2.5 layer pairs (panel (h)). However, in other embodiments the silicon layer transfer-and-thermal oxidation steps can be repeated a number of times to provide a reflector stack with 3, 3.5, 4 or even more layer pairs. Although the silicon thin film release-and-transfer process illustrated in FIG. 1 uses a dry transfer, a wet transfer could also be used, followed by drying.

Because the silicon layer in each layer pair is a layer of single-crystalline silicon, it is distinguishable from silicon layers composed of either polycrystalline or amorphous silicon. In addition, because the silicon dioxide layer is formed via thermal growth, it is a high quality silicon dioxide and is, therefore, distinguishable from spin-on-glass type silicon oxides, which comprise mixtures of non-stoichiometric silicon oxides, commonly denoted as SiO$_x$.

A DBR comprising Ge/SiO$_2$ pairs can be fabricated using the same release-and-transfer steps shown in panels (a), (b), (c), (d), (f) and (h) of FIG. 1 to make the germanium layers. The SiO$_2$ layers can then be deposited on the germanium layers using, for example, plasma-enhanced chemical vapor deposition (PECVD), sputtering, atomic layer deposition (ALD), or evaporation.

The DBRs include a reflector stack having at least two layer pairs and have a thickness of less than 1 μm. This includes embodiments having a reflector stack thickness of no greater than 0.9 μm, further includes embodiments having a reflector stack thickness of no greater than 0.8 μm. In some embodiments, reflector stacks having such small thicknesses have 2.5 layer pairs, while in other embodiments the reflector stacks have 3 layer pairs.

For DBRs comprising $Si/SiO_2$ pairs, the thickness of each layer within the stack and the relative thicknesses of the single-crystalline silicon layer and the $SiO_2$ layers can be carefully controlled, such that the $SiO_2$ layers are thicker than, for example, at least twice as thick as, the single-crystalline silicon layers. By way of illustration, in some embodiments, the $SiO_2$ layer in each layer pair has a thickness of 450 or less and the single-crystalline silicon layer in each layer pair has a thickness of 200 nm or less. This includes embodiments in which the $SiO_2$ layer in each layer pair has a thickness of no greater than 300 nm and the single-crystalline silicon layer in each layer pair has a thickness of no greater than 150 nm. For example, one embodiment of a DBR has two full $Si/SiO_2$ layer pairs and an additional layer of single-crystalline silicon (a half layer pair) to provide a DBR with 2.5 layer pairs. If the Si layers are 110 nm thick and the $SiO_2$ layers are 270 nm thick, the DBR will exhibit high reflectivity at 1.55 μm. If the Si layers are 175 nm thick and the $SiO_2$ layers are 435 nm thick, the DBR will exhibit high reflectivity at 0.98 μm.

Because germanium has a higher refractive index than silicon, the DBRs comprising $Ge/SiO_2$ pairs can achieve similar reflectivities and slightly wider bandwidths using thinner layer pairs (e.g, ~30% thinner). By way of illustration, in some embodiments, the $SiO_2$ layer in each layer pair has a thickness of 100 nm or less and the single-crystalline germanium layer in each layer pair has a thickness of 120 nm or less. For example, one embodiment of a DBR has two full $Ge/SiO_2$ layer pairs and an additional layer of single-crystalline germanium (a half layer pair) to provide a DBR with 2.5 layer pairs. If the Ge layers are 110 nm thick and the $SiO_2$ layers are 90 nm thick, the DBR will exhibit high reflectivity at 1.55 μm. If the Ge layers are 175 nm thick and the $SiO_2$ layers are 145 nm thick, the DBR will exhibit high reflectivity at 0.98 μm.

The stacks are characterized by extremely smooth interfaces between the Group IV semiconductor and silicon dioxide layers. Is some instances, these interfaces are as smooth as those provided by epitaxial growth. For example, the $Si/SiO_2$ interfaces or the $Ge/SiO_2$ interfaces may have an rms roughness of no greater than about 0.5 nm. This includes embodiments in which the $Si/SiO_2$ interfaces or the $Ge/SiO_2$ interfaces have an rms roughness of no greater than about 0.3 nm. The rms roughness of interface can be determined from an AFM image over the area of the interface.

Because the DBRs are not formed by epitaxial growth, which requires a lattice match (or near lattice match) with a growth substrate, the reflector stacks can be formed on a wide variety of substrates. Suitable substrates include electrically conductive (e.g., metal) substrates, dielectric substrates and semiconducting substrates. In some embodiments, the reflector stacks are disposed on a silicon substrate or other group IV material (e.g., germanium or diamond) substrate. However, they can also be disposed on, for example, a substrate of a group III-V semiconductor or a group II-VI semiconductor. Such substrates may be very thin and mechanically flexible.

The DBRs are characterized by high reflectance for wavelengths in the range from about 900 to about 2200 nm—particularly in the range from about 1300 to about 1700 nm and more particularly in the range from about 1400 to about 1670.

The high reflectance can be measured as percent reflectivity on a given substrate, such as silicon or quartz, as illustrated in the Example below or, is the DBRs are incorporated into a laser, such as a VCSEL, the percent reflectivity refers to the reflectivity of the light emitted by the light-emitting active region of the laser. Some embodiments of the DBRs provide a reflectivity of at least 99.5% at a wavelength in these ranges, on a silicon or quartz substrate. This includes DBRs that provide a reflectivity of at least 99.6% at a wavelength of 1550 nm on a quartz substrate and DBRs that provide a reflectivity of at least 99.6% at a wavelength of 980 nm on a quartz substrate.

Figure 2:
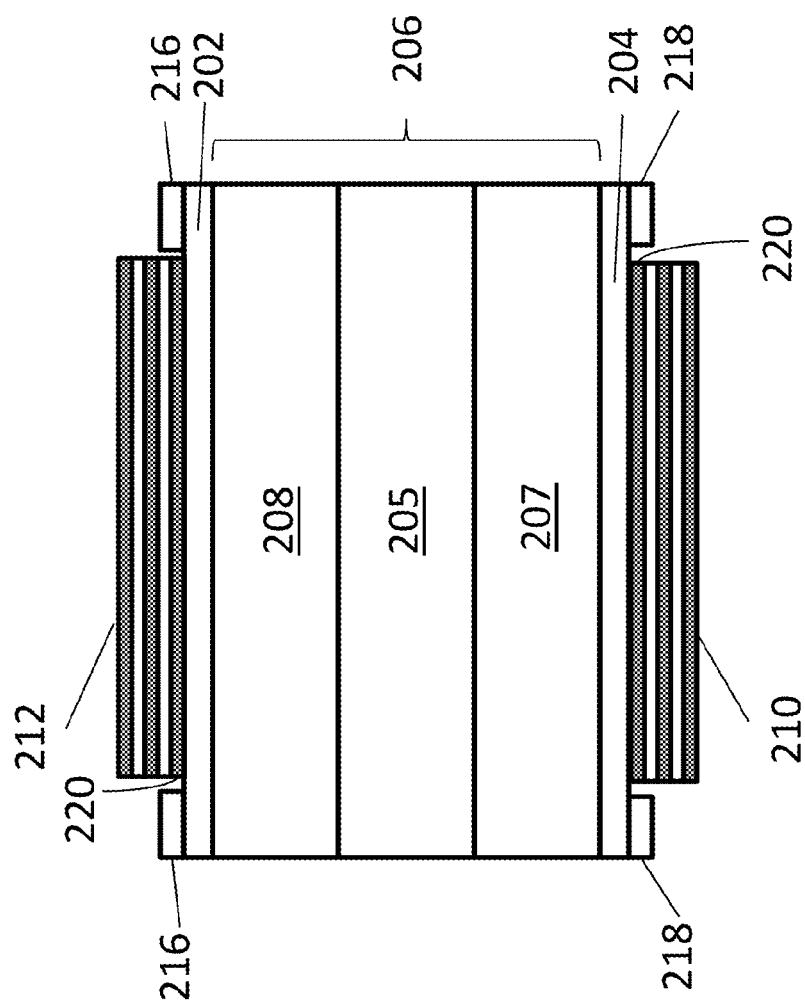
FIG. 2 is a schematic diagram of a vertical cavity surface emitting laser that includes upper and lower DBR composed of Si/SiO$_2$ layer pairs.

The DBRs can be used as passive, stand-alone mirrors that are not incorporated into an electronic or photonic device. Such stand-alone mirrors can be used, for example, in weapons defense applications to deflect incoming laser beams. However, the DBRs can also be integrated into electronic or photonic devices. For example one or more DBRs can be used as the lower and/or upper reflectors in a VCSEL, such that the light-emitting active region of the VCSEL is disposed between the two reflectors. A schematic diagram of one embodiment of a VCSEL comprising a multiple quantum well (MQW) pin diode structure is shown is FIG. 2. The pin diode structure of the VCSEL comprises a hole injection layer comprising a single-crystalline p-type doped semiconductor material 202; an electron injection layer comprising a single-crystalline n-type doped semiconductor material 204; and an intrinsic light-emitting active region 206 disposed between the hole injection layer and the electron injection layer.

Intrinsic active region 206 includes a MQW structure 205 comprising alternating barrier and quantum well layers, which are made of different semiconductor materials. In the MQW structures, charge carriers are confined via quantum confinement in thin layers of one semiconductor "well" material sandwiched between layers of other semiconductor "barrier" material. The active region may further comprise a lower spacer layer 207 and an upper spacer layer 208, between which the MQW structure is disposed. The spacer layers are used to increase the thickness of the intrinsic active region and, because they form part of the intrinsic active region, they are comprised of undoped single-crystalline semiconductor materials. Lower DBR 210 is disposed beneath active region 206 and upper DBR 212 is disposed over active region 206. A dielectric material may be provided around the MQW pin diode structure to provide electrical insulation. Finally, a p-type ring contact 216 and a n-type ring contact 218 are formed on hole injection layer 202 and electron injection layer 204, respectively. In some embodiments, the innermost Group IV semiconductor layers 220 of the reflector stack in one or both DBRs is doped (n-type or p-type) to provide ohmic contacts. In these embodiments, charge injection layers 202 and 204 can be omitted and the ring contacts can be in electrical contact with the doped layers of the DBRs.

The intrinsic active region and the n-type and p-type doped charge injection layers may be fabricated on a suitable growth substrate using known methods, such as molecular beam epitaxy (MBE). The DBRs are incorporated into the VCSEL using a transfer and bonding process. For example, the reflector stacks can be pre-fabricated using the process shown in FIG. 1 and then transferred from their support substrate 110 onto a MQW pin diode structure. Alternatively, the MQW pin diode structure can be used as support substrate 110, such that the $Si/SiO_2$ pairs or $Ge/SiO_2$ pairs of the reflector stacks are formed directly on that structure.

Because the DBRs are incorporated into the VCSEL via a transfer and bonding process, the interfaces formed between the reflector stacks and the hole and electron injection layers do not have an epitaxial structure. As used herein the term "epitaxial structure" refers to a structure in which the crystallographic orientation of an overlying layer is determined by (matches) that of its underlying layer, such that the two layers have the same crystallographic orientation, at least in the area of their interface. Such epitaxial structures may include strains and stresses at the interface, induced by a lattice mismatch between the two materials and may even include misfit dislocations. In contrast to such epitaxial interfaces, non-epitaxial interfaces in the present structures have crystallographic orientations that are independent from (e.g., different from) those of their neighboring layers. As a result, the semiconductor materials of the MQW pin diode structure need not be lattice matched to the silicon or germanium of the DBRs. For example, semiconductor materials of the active region and/or the hole and/or electron injection layers can be independently selected from a broad range of semiconductors including: (a) group IV semiconductors; (b) group III-V semiconductors; and (c) group II-VI semiconductors. The group IV semiconductors include elemental semiconductors (e.g., Si, Ge and C, including diamond), as well as alloy and compound semiconductors (e.g., SiGe:C, SiGe, SiGeSn and SiC). The group III-V and group II-VI semiconductors include binary, ternary and higher compound semiconductors. Examples of group III-V semiconductors include GaAs, AlGaAs, InGaAs, AlAs, InAlAs, InP, GaInP, GaP, GaN, InGaN, InAlN, AlN and AlGaN. Examples of group II-VI semiconductors include oxides, such as ZnO. For example, a VCSEL configured to emit infrared radiation in the wavelength range from about 1400 to 1670 nm could employ an active region having an MQW structure comprising alternating layers of single-crystalline InGaAs quantum well layers and single-crystalline InP barrier layers.

Figure 3:
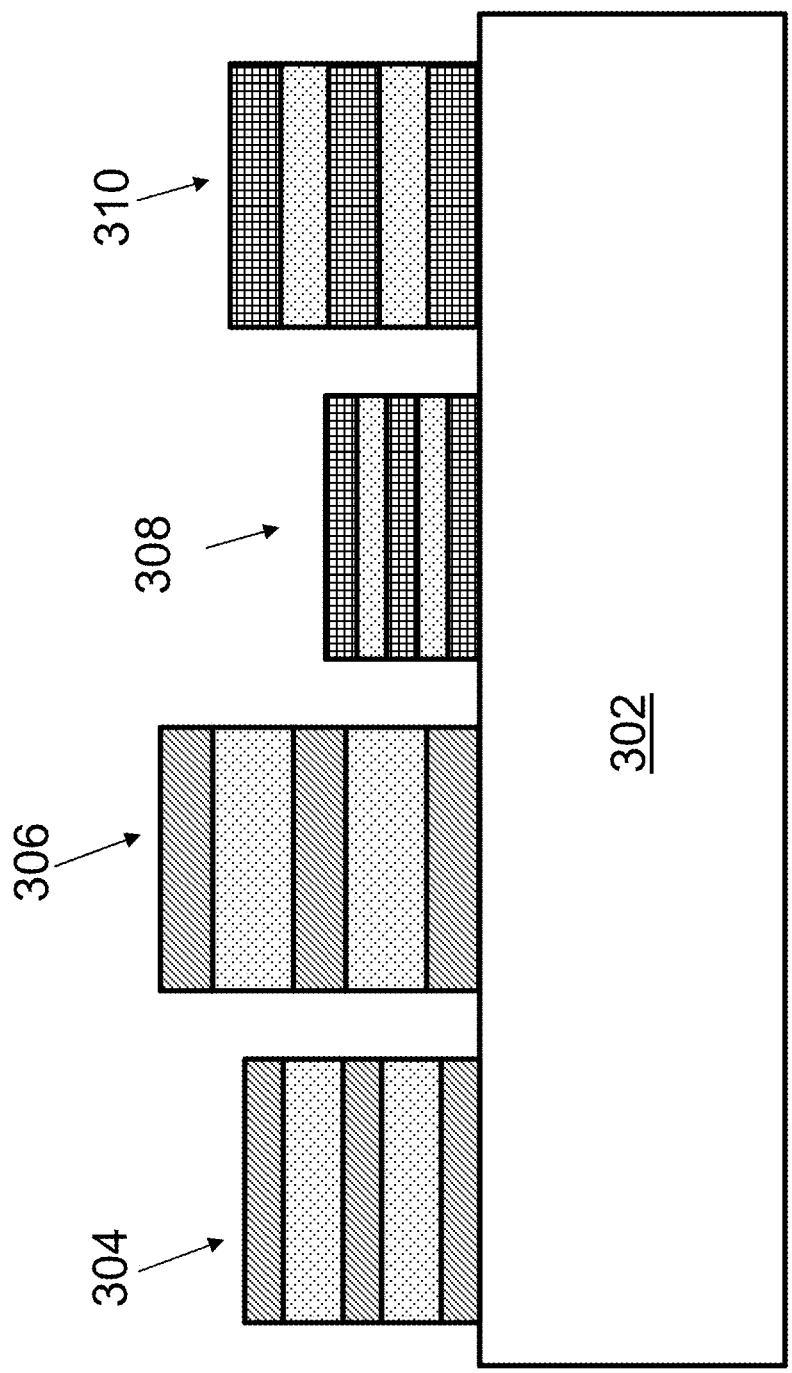
FIG. 3 is a schematic diagram of a DBR array.

The transfer and bonding-based fabrication scheme makes it possible to fabricate a DBR array comprising a plurality (for example at least ten, at least 100, at least 1000) of DBRs on the same substrate, wherein different DBRs in the array are configured to reflect radiation having different wavelength ranges. For example the DBR array may comprise one or more DBR comprising $Si/SiO_2$ pairs and one or more DBR comprising $Ge/SiO_2$ pairs. Additionally, (or alternatively) the DBR array may comprises one or more DBRs comprising $Si/SiO_2$ pairs, wherein one or more of the DBRs are configured to reflect radiation over a first wavelength range and one or more of the DBRs are configured to reflect radiation over a second wavelength range that differs from said first wavelength range. Similarly, the DBR array may comprises one or more DBRs comprising $Ge/SiO_2$ pairs, wherein one or more of the DBRs are configured to reflect radiation over a first wavelength range and one or more of the DBRs are configured to reflect radiation over a second wavelength range that differs from said first wavelength range. An embodiment of a DBR array of this type is illustrated in FIG. 3.

The DBR array includes a substrate 302 and a plurality of DBRs on the surface of substrate 302. The first DBR 304 comprises 2.5 $Si/SiO_2$ layer pairs and the second DBR 306 also comprises 2.5 $Si/SiO_2$ layer pairs. The first and second layer pairs are different thicknesses because they are configured to reflect different wavelength ranges. The third DBR 308 comprises 2.5 $Ge/SiO_2$ layer pairs and the fourth DBR 310 also comprises 2.5 $Ge/SiO_2$ layer pairs. The third and fourth layer pairs are different thicknesses because they are configured to reflect different wavelength ranges.

The transfer and bonding-based fabrication scheme also makes it possible to fabricate a VCSEL array comprising a plurality (for example at least ten, at least 100, at least 1000) of VCSELs on the same substrate, wherein different VCSELs in the array are configured to emit radiation having different wavelengths. For example the VCSEL array may comprise one or more VCSELs comprising $Si/SiO_2$ pairs in their DBRs and one or more VCSELs comprising $Ge/SiO_2$ pairs in their DBRs. Additionally, (or alternatively) the VCSEL array may comprises one or more VCSELs comprising DBRs having $Si/SiO_2$ pairs, wherein one or more of the VCSELs are configured to emit radiation at a first wavelength and one or more of the VCSELs are configured to emit radiation at a second wavelength that differs from said first wavelength. Similarly, the VCSEL array may comprises one or more VCSELs comprising DBRs having $Ge/SiO_2$ pairs, wherein one or more of the VCSELs are configured to emit radiation at a first wavelength and one or more of the VCSELs are configured to emit radiation at a second wavelength that differs from said first wavelength.

EXAMPLES

This example illustrates methods of making high reflectivity, ultra-thin DBRs using a thin layer transfer and bonding process in combination with thermal oxide growth.

Simulations.

In order to obtain layer parameters for the best DBR reflection, simulations were carried out with MEEP software (a finite-difference time-domain (FDTD) simulation software package developed and distributed by MIT). $Si/SiO_2$ layer thicknesses of 110 nm/270 nm were extracted and a reflectance of greater than 99% was predicted for a 2.5-layer pair DBR on a quartz substrate and a 3-layer pair DBR on a Si substrate.

Materials and Methods.

Figure 4:
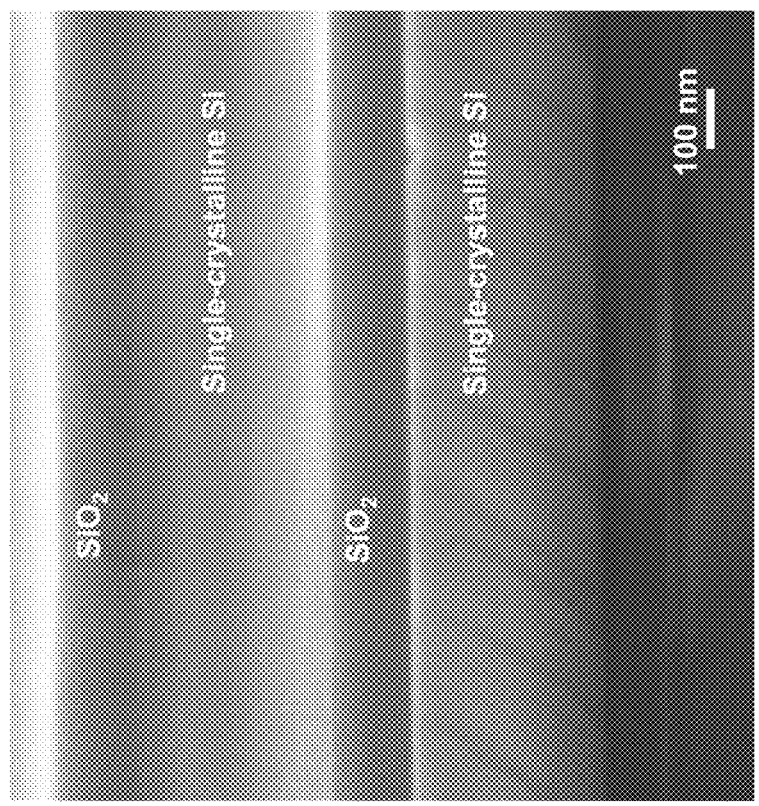
FIG. 4 is a scanning electron microscope (SEM) image of a cross-section of a DBR composed of Si/SiO$_2$ layer pairs.
Figure 5:
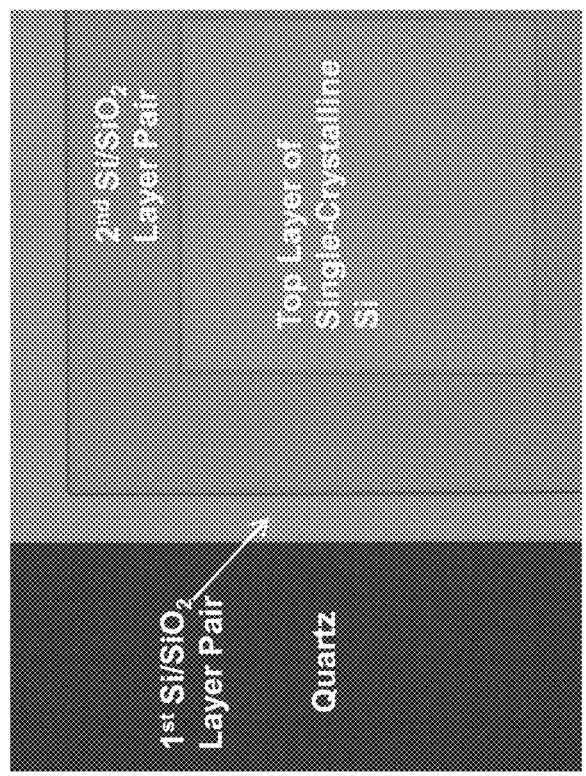
FIG. 5 is an optical microscope image of a DBR composed of Si/SiO$_2$ layer pairs.

The $Si/SiO_2$ DBRs were fabricated according to the process illustrated in FIG. 1. Fabrication started by thinning down the top single-crystalline Si layer of SOI wafer (SOITEC, 340 nm/2000 nm, Si/buried oxide) from 340 nm down to 234 nm using thermal oxidation and wet etching with a hydrofluoride solution (HF, 49%). The SOI sample was immersed in HF to undercut the buried oxide layer and, eventually, release the thinned single-crystalline Si layer. The released Si layer had an area of about 1 mm$^2$. The layer of single-crystalline Si settled onto the underlying handle wafer of the SOI and was rinsed with deionized (DI) water. Then the thin layers of single-crystalline Si were transferred onto quartz or silicon support substrates using a polydimethylsiloxane (PDMS) stamp as an intermediate host substrate. For the DBRs on silicon substrates, a 270 nm thermal oxide was grown on the substrate prior to the transfer of the single-crystalline silicon layer. A detailed description of the transfer procedure can be found in K. Zhang, J.-H. Seo, W. Zhou, and Z. Ma, "Fast flexible electronics using transferrable silicon nanomembranes," *J. Phys. D: Appl. Phys.* 45, 143001 (2012) and W. Zhou, D. Zhao, Y.-C. Shuai, H. Yang, S. Chuwongin, A. Chadha, J.-H. Seo, K. X. Wang, V. Liu, Z. Ma, and S. Fan, "Progress in 2D photonic crystal Fano resonance photonics," *Prog. Quantum Electron.* 38, 1-74 (2014). After the single-crystalline Si layers were transferred, a wet oxidation process was carried out at 1050° C. to grow a 270 nm thick layer of $SiO_2$. This thermal oxidation consumed 124 nm of the single-crystalline Si layer. Thus, the final $Si/SiO_2$ layer thicknesses were exactly 110 nm and 270 nm. The transferred layers of single-crystalline Si were bonded completely during the thermal oxidation process. Following the oxidation, another layer of single-crystalline Si was transferred onto the top surface of the $SiO_2$ layer. This cycle was repeated until the desired number of $Si/SiO_2$ pairs was formed. An optical microscope image of a 1 mm$^2$ sized $Si/SiO_2$ DBR on a quartz substrate is shown in FIG. 5. A cross-sectional SEM image showing two precisely defined and tightly bonded Si/SiO$_2$ layer pairs is shown in FIG. 4.

Figure 6A:
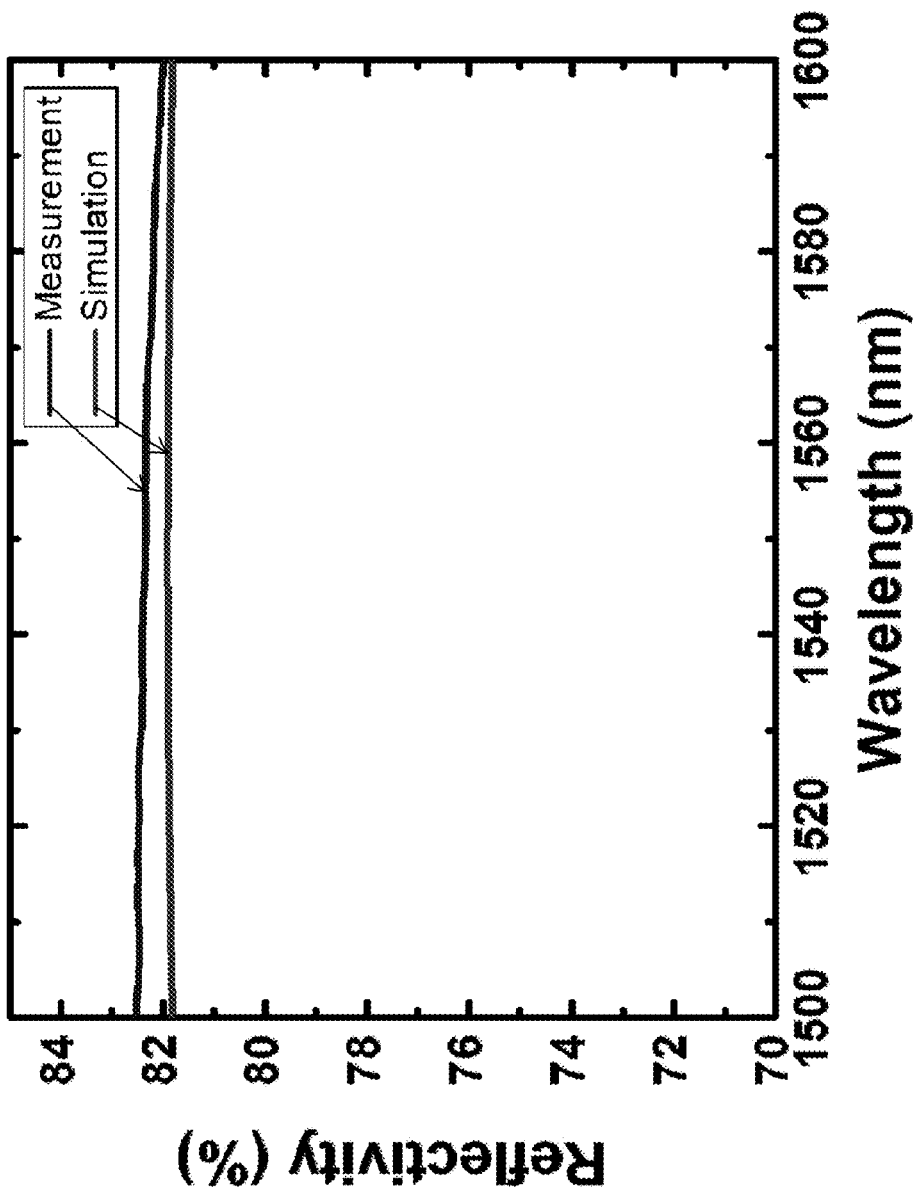
FIG. 6A shows the measured (upper line) and FDTD simulated (lower line) reflection spectra for a single-pair Si/SiO$_2$ DBR with a silicon substrate in the range from 1500 to 1600 nm.
Figure 6B:
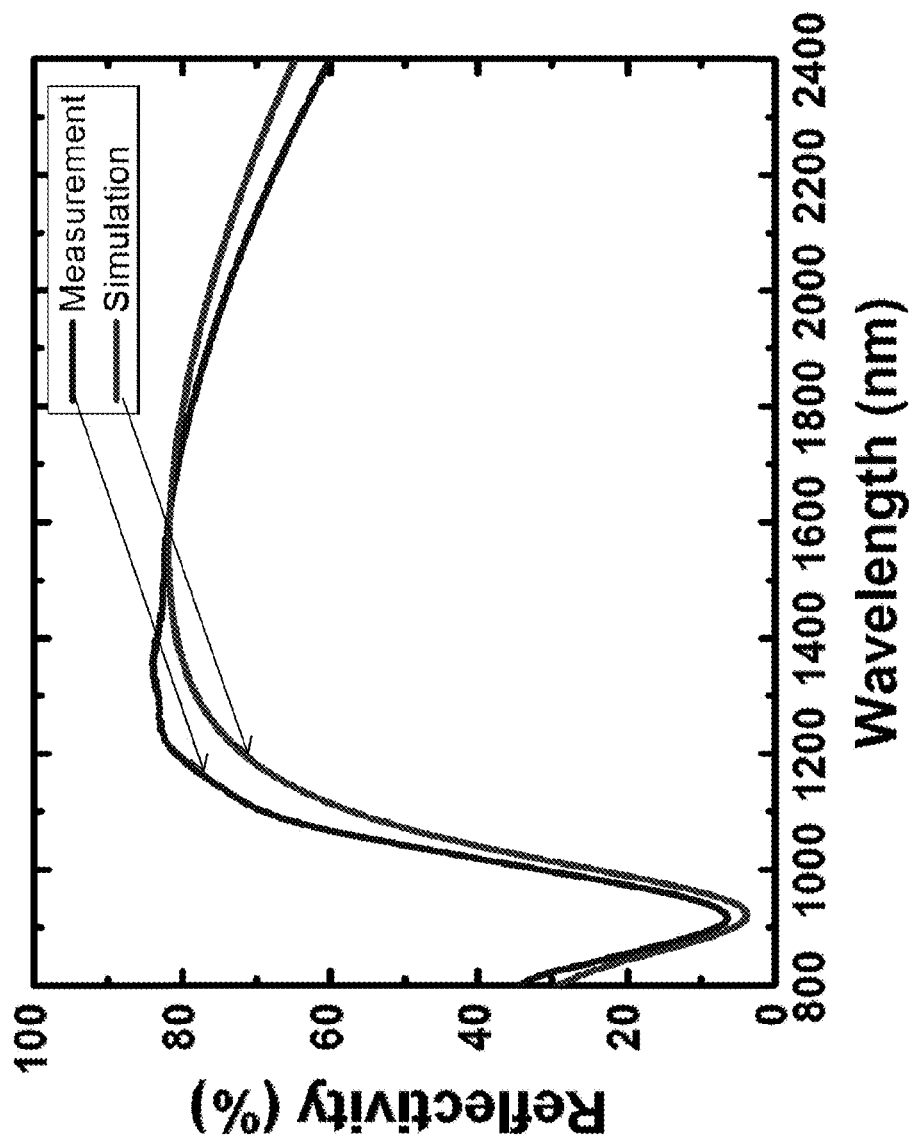
FIG. 6B shows the reflection spectra in the range from 800 nm to 2400 nm.
Figure 7A:
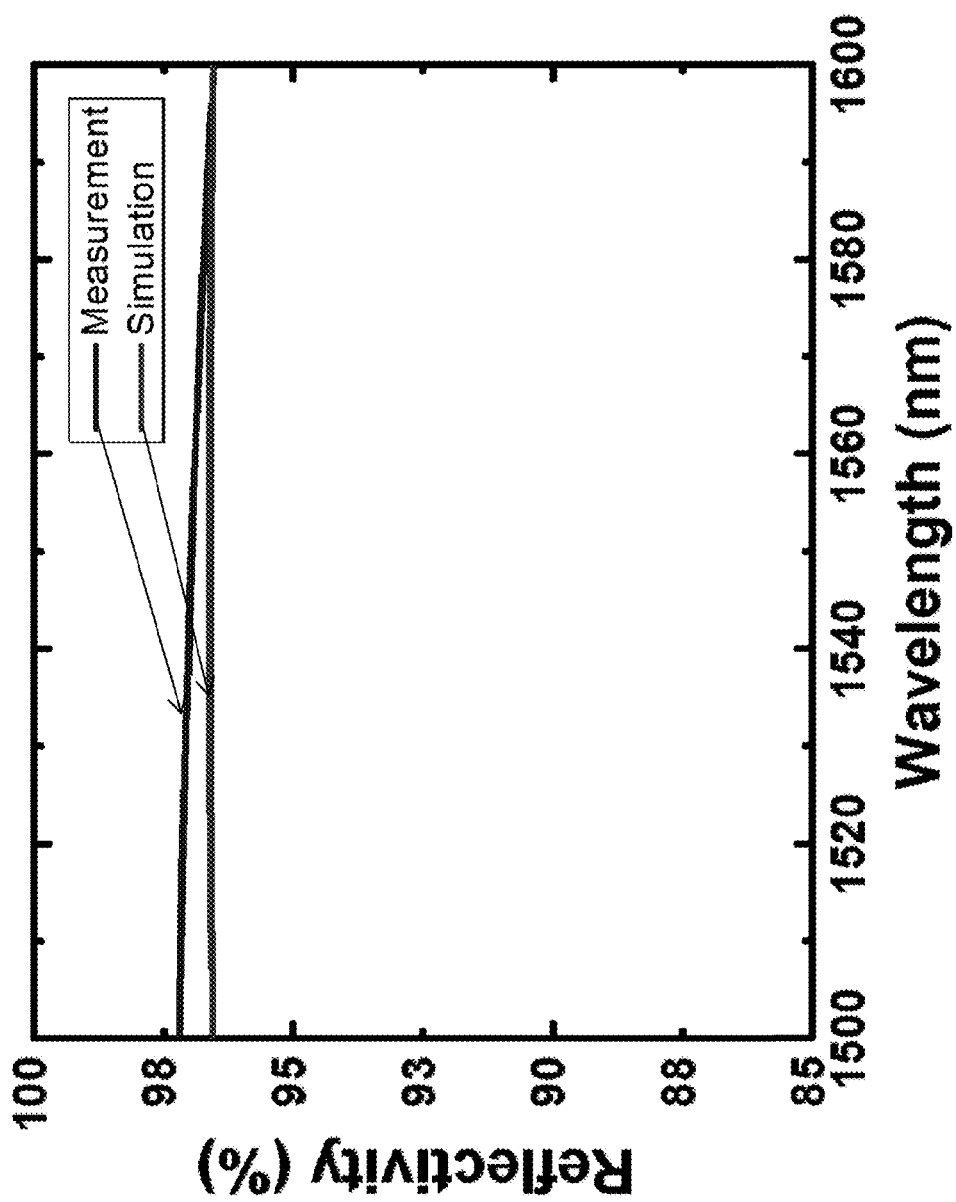
FIG. 7A shows the measured (upper line) and FDTD simulated (lower line) reflection spectra for a two-pair Si/SiO$_2$ DBR with a silicon substrate in the range from 1500 to 1600 nm.
Figure 7B:
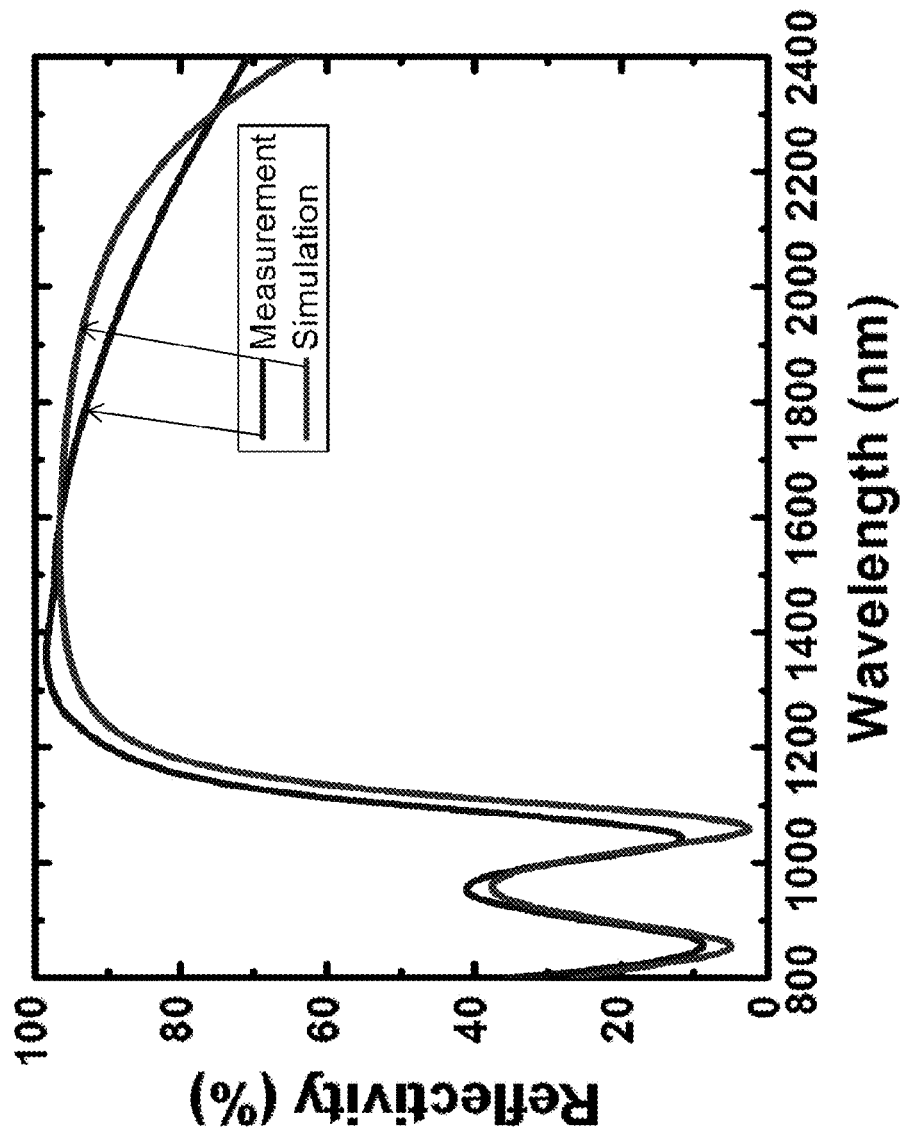
FIG. 7B shows the reflection spectra in the range from 800 nm to 2400 nm.
Figure 8A:
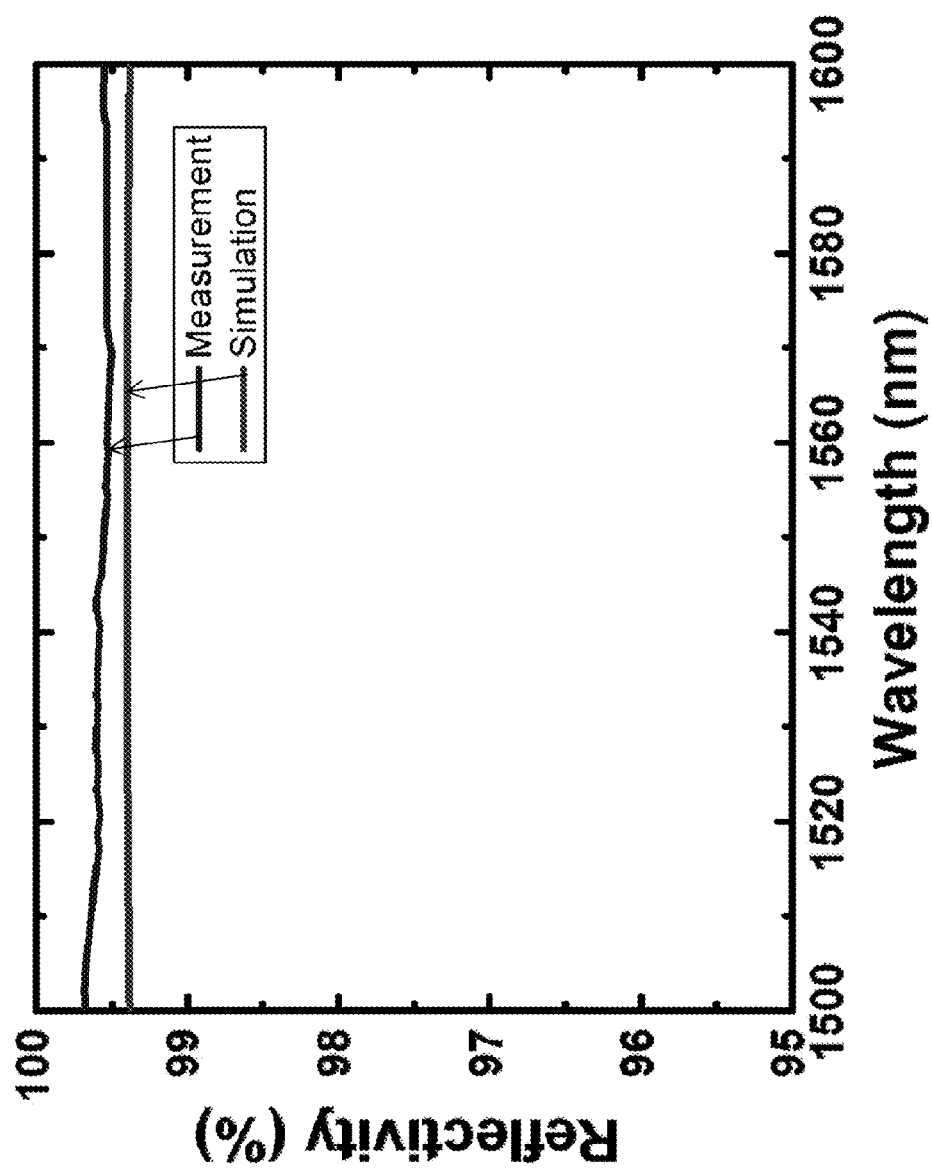
FIG. 8A shows the measured (upper line) and FDTD simulated (lower line) reflection spectra for a three-pair Si/SiO$_2$ DBR with a silicon substrate in the range from 1500 to 1600 nm.
Figure 8B:
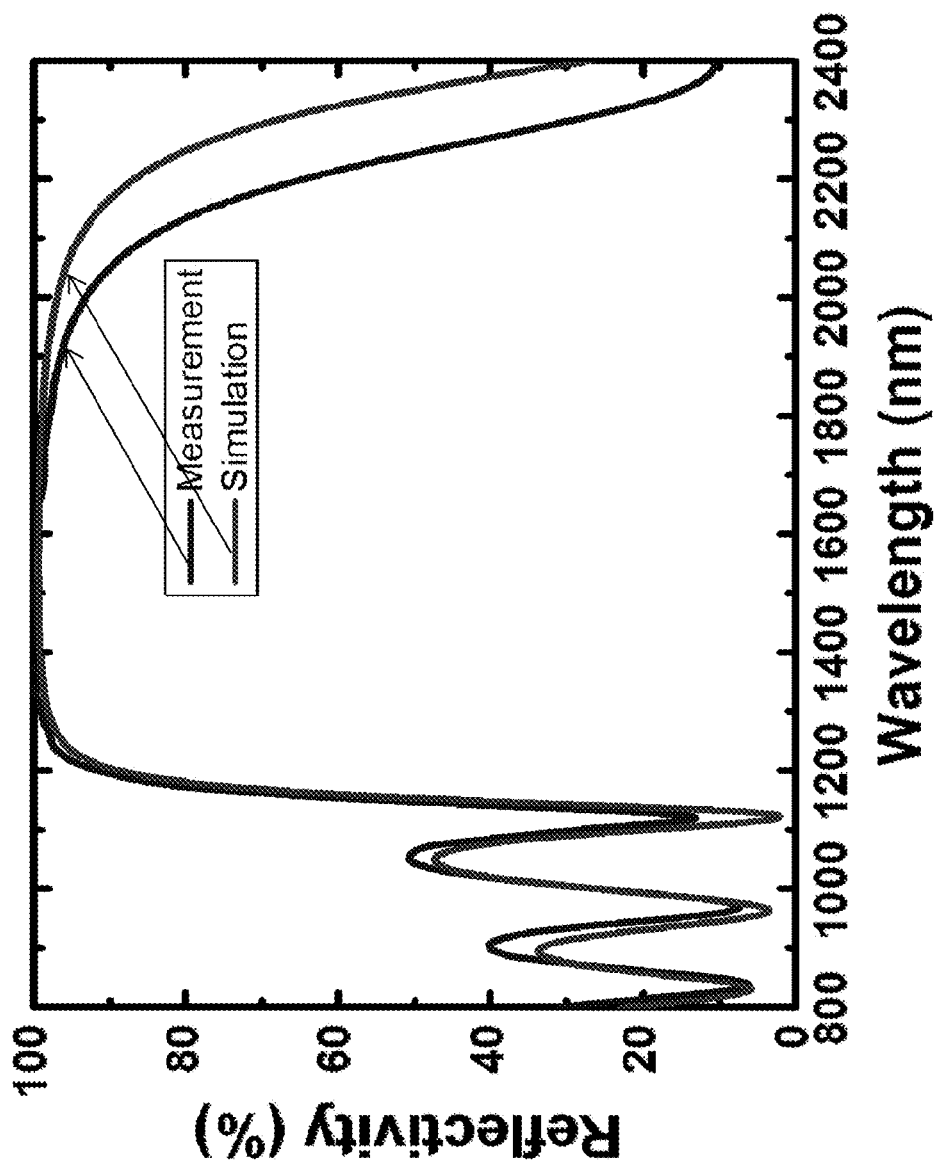
FIG. 8B shows the reflection spectra in the range from 800 nm to 2400 nm.
Figure 9A:
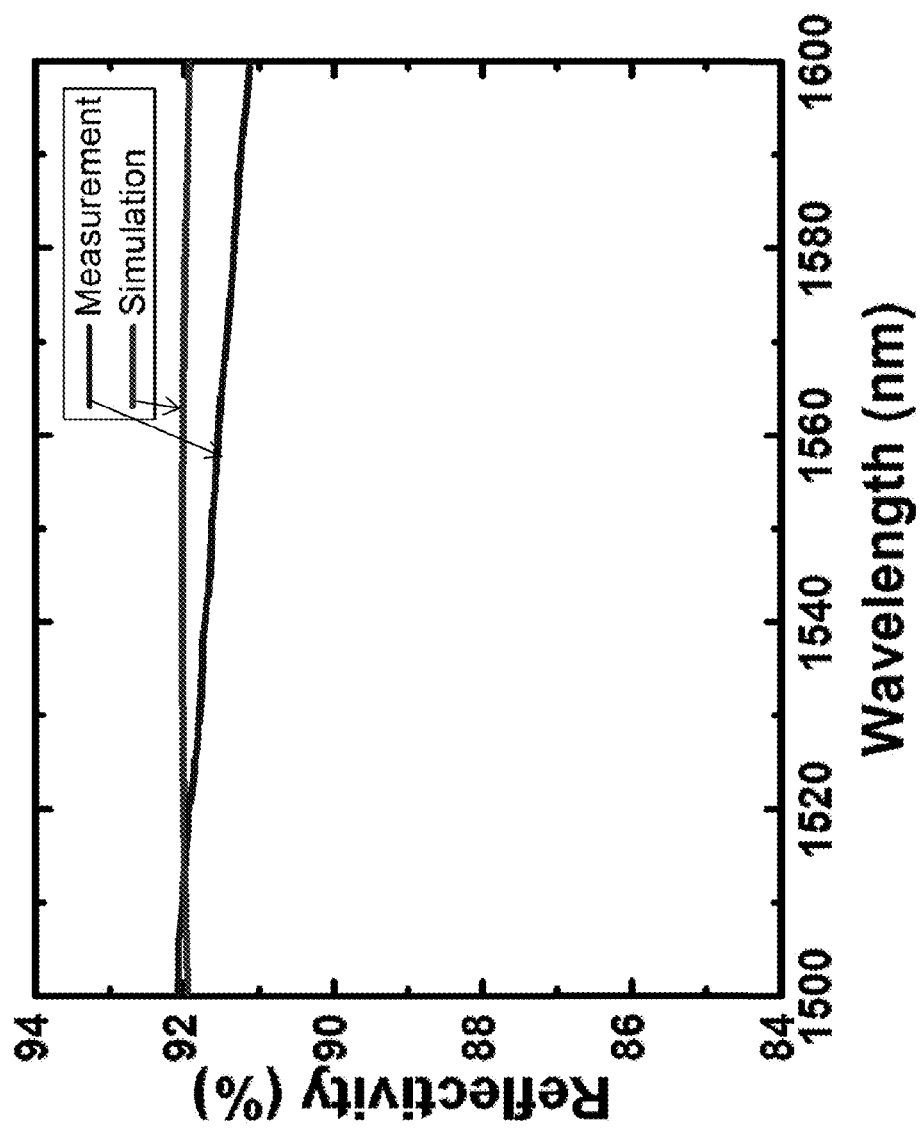
FIG. 9A shows the measured (lower line) and FDTD simulated (upper line) reflection spectra for a 1.5-pair Si/SiO$_2$ DBR with a quartz substrate in the range from 1500 to 1600 nm.
Figure 9B:
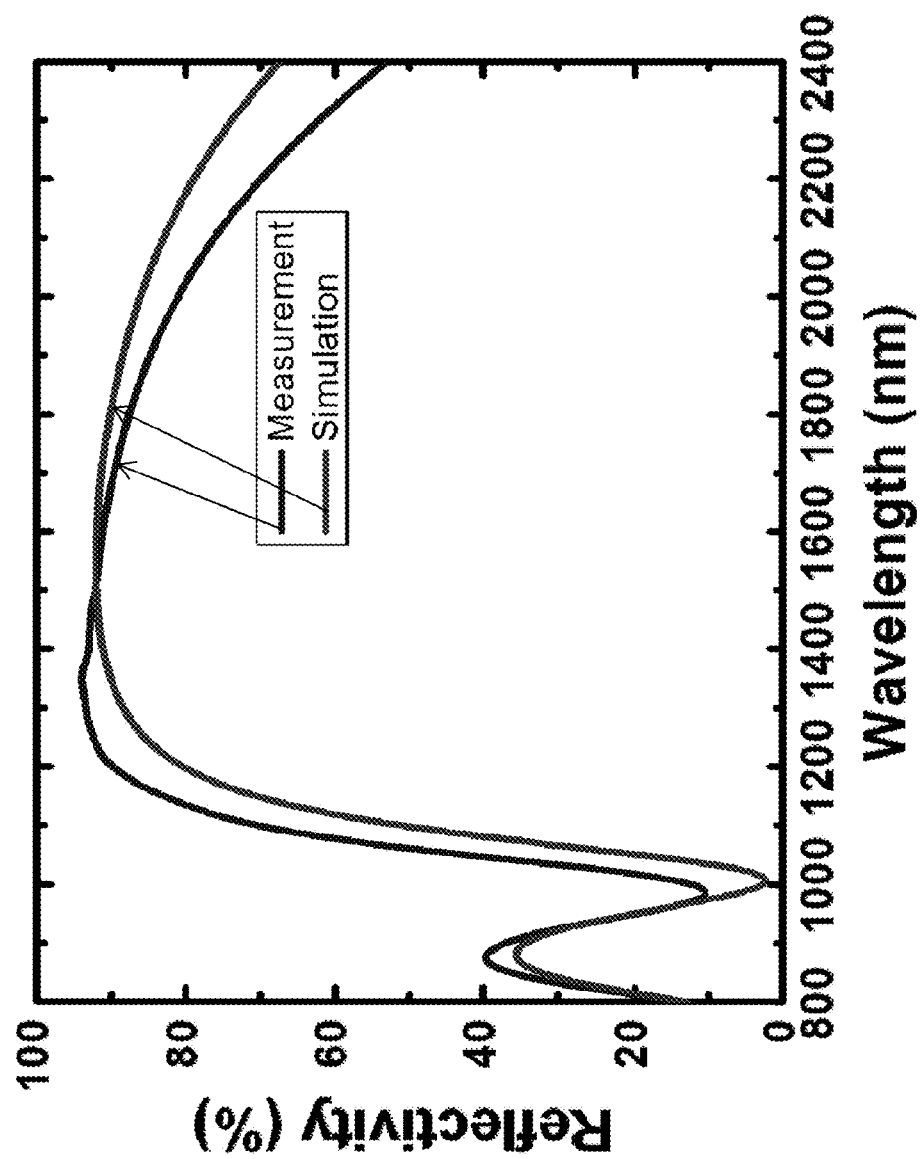
FIG. 9B shows the reflection spectra in the range from 800 nm to 2400 nm.
Figure 10A:
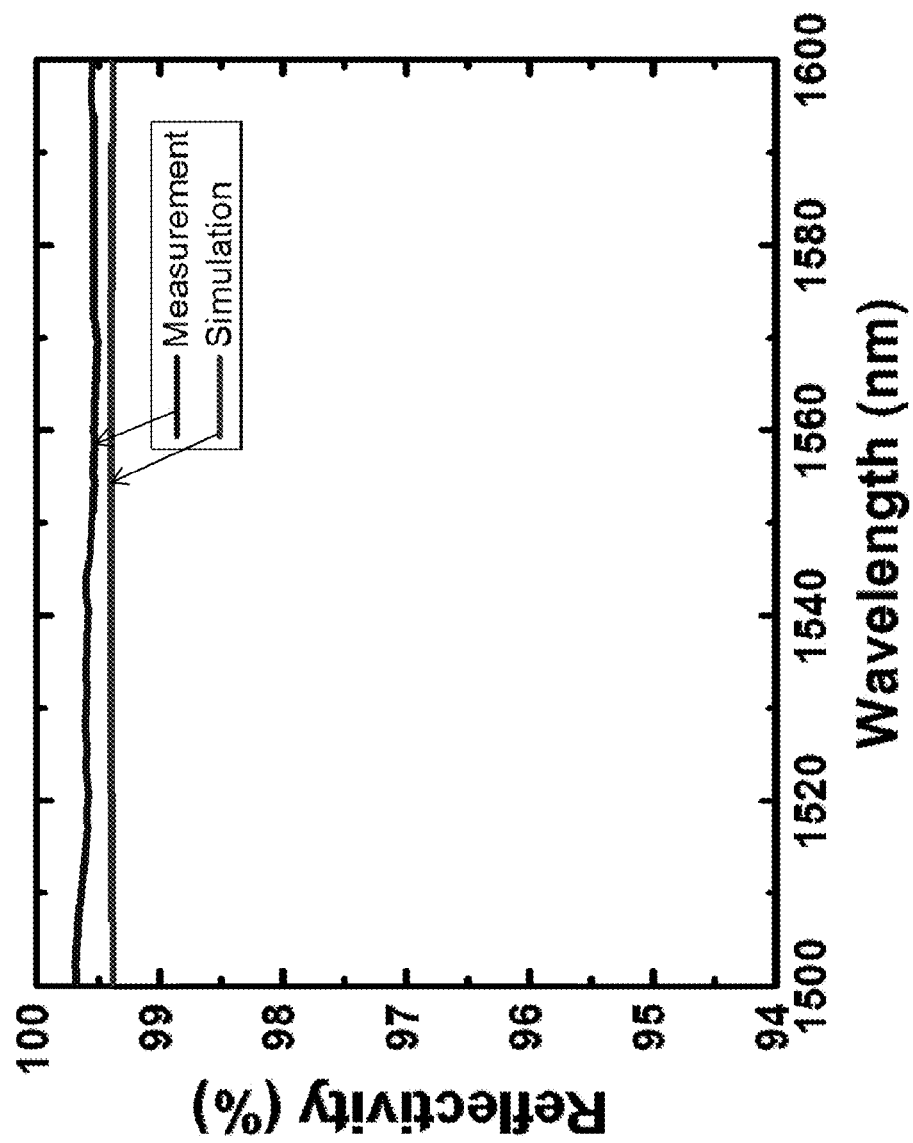
FIG. 10A shows the measured (upper line) and FDTD simulated (lower line) reflection spectra for a 2.5-pair Si/SiO$_2$ DBR with a quartz substrate in the range from 1500 to 1600 nm.
Figure 10B:
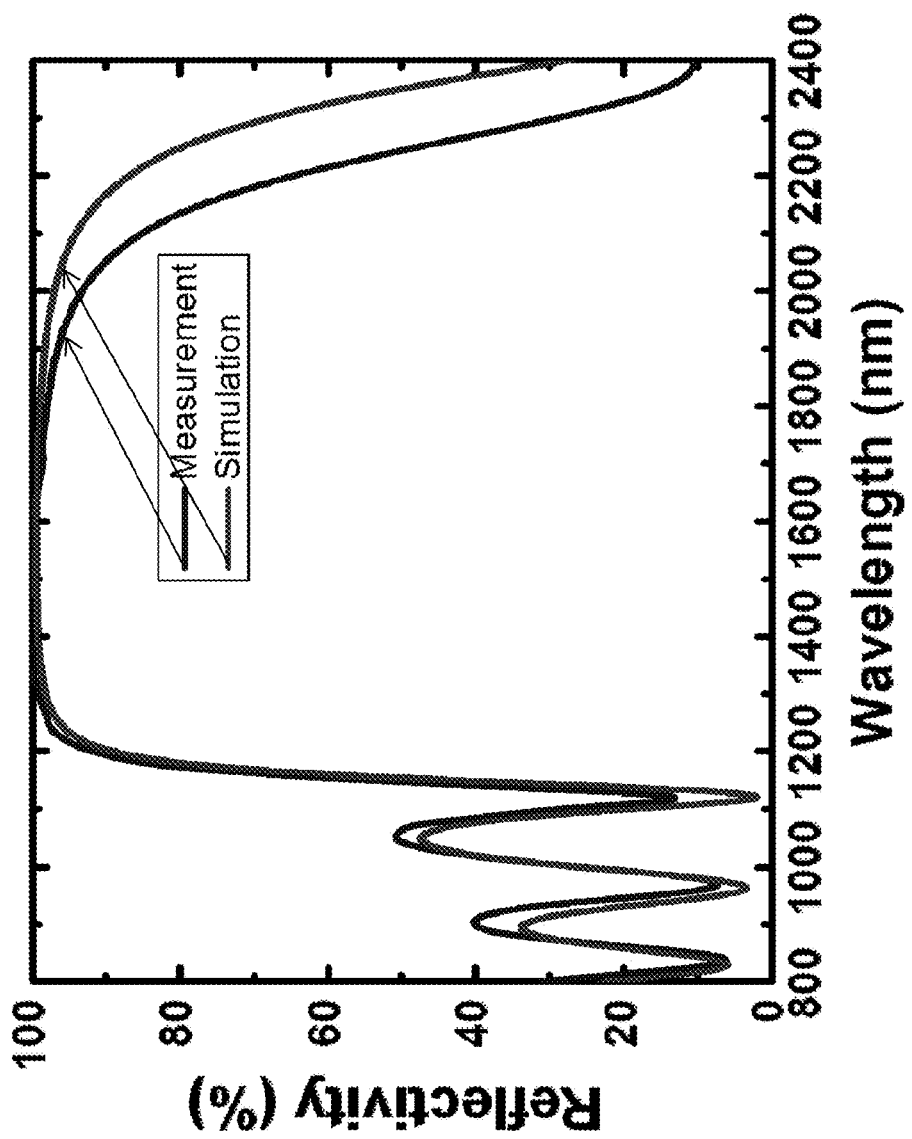
FIG. 10B shows the reflection spectra in the range from 800 nm to 2400 nm.

Reflection spectra were carefully taken using a custom build reflection measurement system in connection with a Fourier transform infrared spectroscopy (FTIR) system at room temperature (~23° C.). The simulated and measured reflection spectra for a single-pair, a two-pair, and a three-pair Si/SiO$_2$ DBR on silicon substrates are shown in FIGS. 6, 7 and 8, respectively. The measured spectra agree very well with the simulated spectra and were blue shifted, closer to the simulated reflection spectra, as the number of layer pairs was increased. On these substrates with high refractive indexes, a high reflection, as high as 99.65% at a wavelength of 1550 nm, was achieved by stacking three Si/SiO$_2$ layer pairs in a reflector stack having a total thickness of 1.14 µm. The bandwidth over which the DBR maintained a reflectivity of 99.5% or higher was about 270 nm (from 1400 to 1670 nm). For the Si/SiO$_2$ DBRs on the quartz substrates, the measured and simulated reflection spectra are shown in FIGS. 9 and 10. A half pair was added for the DBRs on quartz substrates, because the initial DBR layer started with a 110 nm thick layer of single-crystalline Si. The measured spectra agree well with the simulated results and show less deviation from the simulated reflection spectra. The total thickness of the 2.5-pair DBR on Si and the 3-pair DBR on quartz are 0.87 µm. Reflectivity as high as 99.65% at a wavelength of 1550 nm was achieved by the 2.5-pair Si/SiO$_2$ reflector stack, which had a total thickness is 0.87 µm. The bandwidth over which the DBR maintained a reflectivity of 99.5% or higher was about 400 nm (from 1300 to 1700 nm). Overall, both types of DBRs had reflectivities greater than 99.4% with ~1.2 µm at Full width at Half Maximum (FWHM).

Figure 11A:
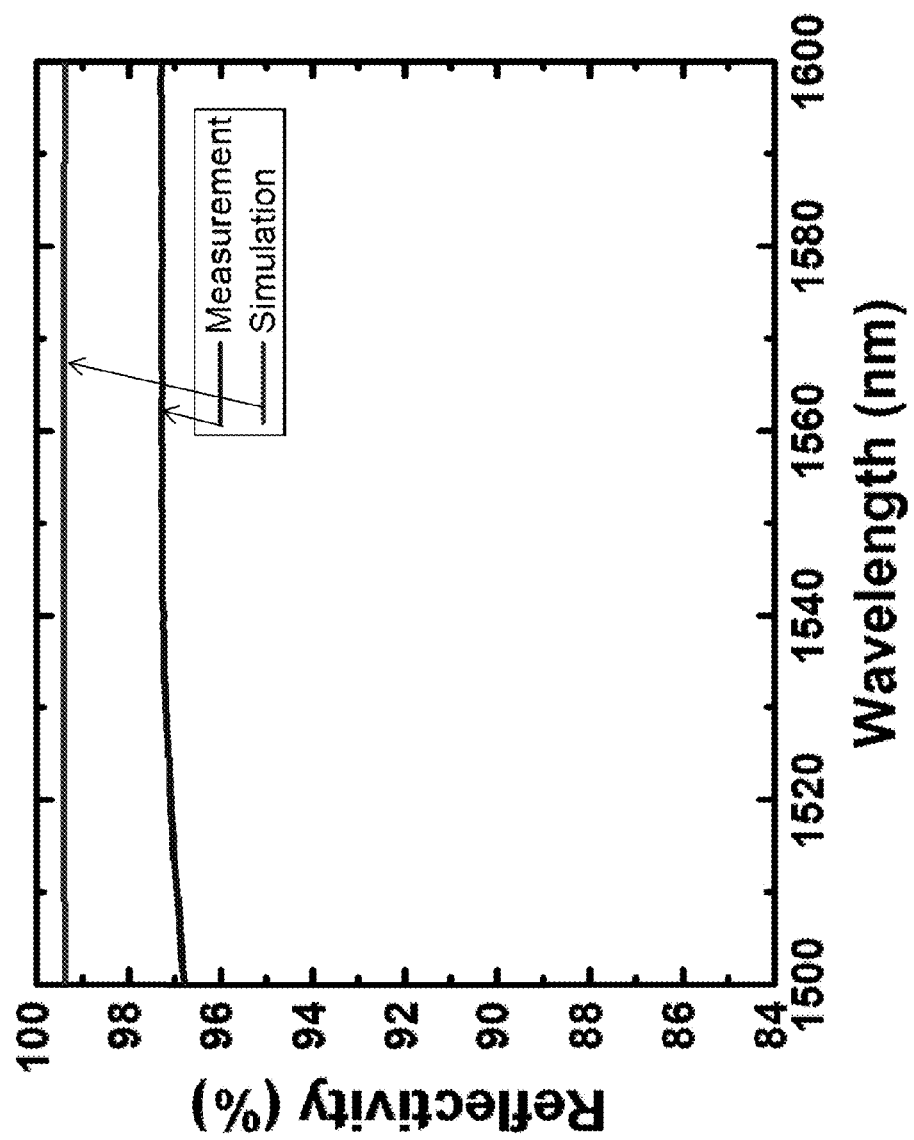
FIG. 11A shows the measured (lower line) and FDTD simulated (upper line) reflection spectra for a 5.5-pair poly-Si/SiO$_2$ DBR with a quartz substrate in the range from 1500 to 1600 nm as a comparison.
Figure 11B:
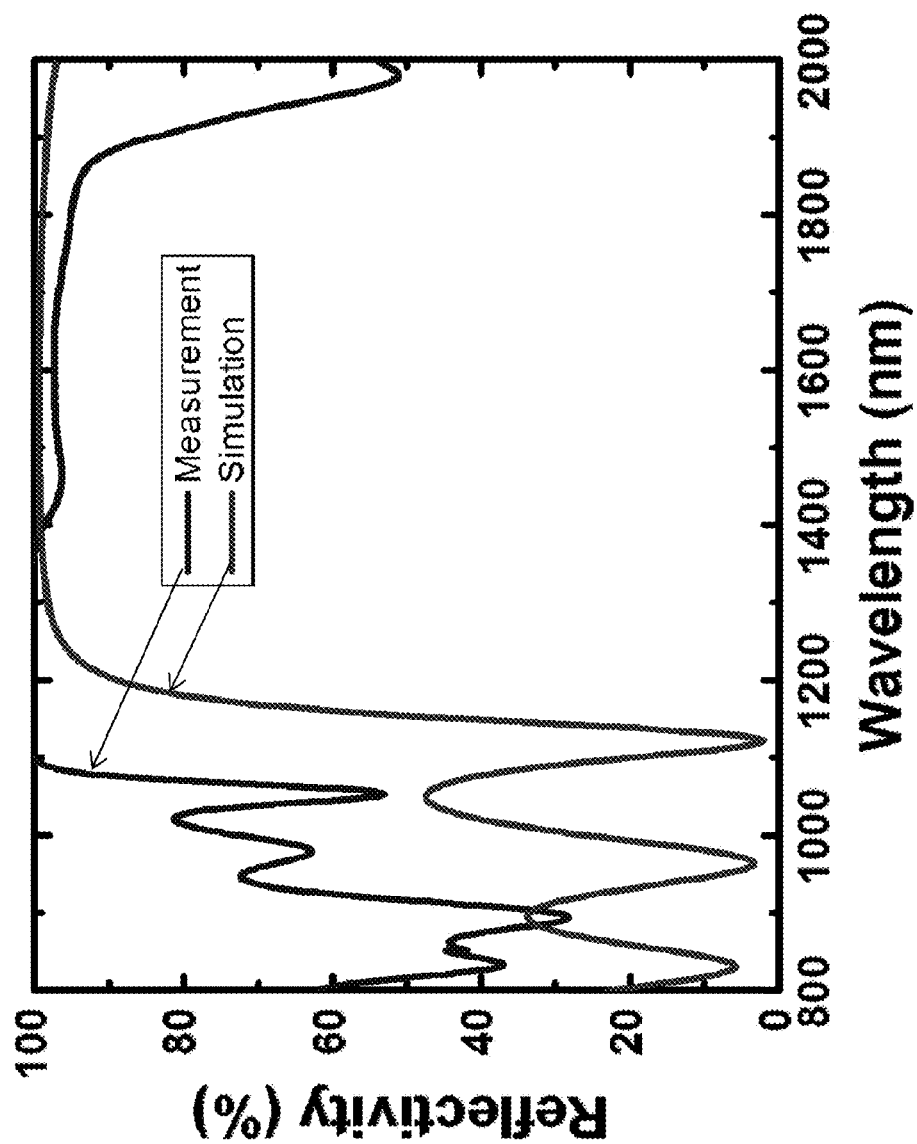
FIG. 11B shows the reflection spectra in the range from 800 nm to 2000 nm.

As a comparative example, DBRs were made by forming multi-pairs of polycrystalline-Si/PECVD SiO$_2$ on quartz substrates. The polycrystalline-Si layers were deposited by a LPCVD under vacuum at 700° C. and the SiO$_2$ layers were deposited by PECVD at 350° C. The reflectivity of these DBRs (shown in FIG. 11) reached >99% after depositing 5.5 layer pairs of poly-Si/SiO$_2$, which is comparable to that of 2.5 pairs of single-crystalline Si/SiO$_2$ DBRs on a quartz substrate, but with more than twice the total thickness.

In summary, high quality and ultra-thin single-crystalline Si/SiO$_2$ DBRs were demonstrated with a thin layer silicon transfer-and-bonding process in combination with thermal oxidation of the silicon for SiO$_2$ growth. DBRs with different numbers of layer pairs were fabricated on both Si and quartz substrates, and their simulated and measured reflectance were compared. A reflectivity of 99.65% in the wavelength range from 1350 nm to 1650 nm was measured from both a 2.5-layer pair DBR on a quartz substrate and a 3-layer pair DBR on a silicon substrate with total thicknesses of 0.87 µm and 1.14 µm, respectively.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A distributed Bragg reflector comprising:
a reflector stack comprising at least two adjacent layer pairs, each layer pair comprising:
a layer of a single-crystalline Group IV semiconductor having a surface; and
an adjacent layer of silicon dioxide having a surface; wherein the surface of the layer of single-crystalline Group IV semiconductor and the surface of the adjacent layer of silicon dioxide form an interface between the layer of single-crystalline Group IV semiconductor and the adjacent layer of silicon dioxide;
wherein the thickness of the reflector stack is no greater than 1 µm; the root mean square roughness of the interface formed by the layer of single-crystalline Group IV semiconductor and the layer of silicon dioxide of the first of the at least two adjacent layer pairs is no greater than 0.5 nm; and the root mean square roughness of the interface formed by the layer of single-crystalline Group IV semiconductor and the layer of silicon dioxide of the second of the at least two adjacent layer pairs is no greater than 0.5 nm.

2. The reflector of claim 1, wherein the thickness of each layer pair is no greater than 450 nm and the layers of silicon dioxide are at least twice as thick as the layers of single-crystalline silicon.

3. The reflector of claim 1, the reflector stack having from two and a half to three adjacent layer pairs.

4. The reflector of claim 1, wherein the single-crystalline Group IV semiconductor of each layer pair silicon.

5. The reflector of claim 4, wherein the thickness of each layer pair is no greater than 650 nm and the layers of silicon dioxide are at least twice as thick as the layers of single-crystalline silicon.

6. The reflector of claim 5, wherein the layers of single-crystalline silicon have a thickness of about 110 nm and the layers of silicon dioxide have a thickness of about 270 nm and further wherein the reflector reflects light having a wavelength of 1.55 µm.

7. The reflector of claim 4, wherein the reflector has only three layer pairs and is characterized in that that it provides a reflectivity of at least 99.5% at a wavelength within the range from 1400 to 1670 nm on a silicon substrate.

8. The reflector of claim 4, the reflector stack comprising only two complete layer pairs and further comprising a layer of single-crystalline silicon on the second complete layer pair to provide a stack of 2.5 layer pairs, wherein the reflector is characterized in that that it provides a reflectivity of at least 99.6% at a wavelength of 1550 nm on a quartz substrate.

9. The reflector of claim 1, wherein the single-crystalline Group IV semiconductor of each layer pair is germanium.

10. The reflector of claim 1, further comprising a substrate on which the stack of layer pairs is disposed, such that the lowermost layer of single-crystalline silicon in the stack is in contact with the substrate.

11. The reflector of claim 10, wherein the substrate is not silicon.

12. The reflector of claim 1, the reflector stack characterized in that it provides a reflectivity of at least 99.4% over the wavelength range from 1400 nm to 1670 nm on a silicon or quartz substrate.

13. An array of reflectors comprising a plurality of the reflectors of claim 1 on a substrate, wherein different reflectors in the array are configured to reflect light over different wavelength ranges.

14. The distributed Bragg reflector of claim 1, wherein the silicon dioxide of each layer pair is not a spin-on-glass type silicon oxide comprising mixtures of non-stoichiometric silicon oxides.

15. A distributed Bragg reflector comprising:
a reflector stack comprising at least two adjacent layer pairs, each layer pair comprising:
a layer of a single-crystalline Group IV semiconductor having a surface; and
an adjacent layer of silicon dioxide having a surface; wherein the surface of the layer of single-crystalline Group IV semiconductor and the surface of the adjacent layer of silicon dioxide form an interface between the layer of single-crystalline Group IV semiconductor and the adjacent layer of silicon dioxide;
wherein the root mean square roughness of the interface formed by the layer of single-crystalline Group IV semiconductor and the layer of silicon dioxide of the first of the at least two adjacent layer pairs is no greater than 0.5 nm; and the root mean square roughness of the interface formed by the layer of single-crystalline Group IV semiconductor and the layer of silicon dioxide of the second of the at least two adjacent layer pairs is no greater than 0.5 nm;
wherein the layers of single-crystalline silicon have a thickness of about 175 nm and the layers of silicon dioxide have a thickness of about 435 nm and further wherein the reflector reflects light having a wavelength of 0.98 μm.

16. The distributed Bragg reflector of claim 15, wherein the silicon dioxide of each layer pair is not a spin-on-glass type silicon oxide comprising mixtures of non-stoichiometric silicon oxides.

17. A vertical cavity surface emitting laser comprising:
a lower distributed Bragg reflector comprising:
a reflector stack comprising at least two adjacent layer pairs, each layer pair comprising:
a layer of a single-crystalline Group IV semiconductor having a surface; and
an adjacent layer of silicon dioxide having a surface; wherein the surface of the layer of single-crystalline Group IV semiconductor and the surface of the adjacent layer of silicon dioxide form an interface between the layer of single-crystalline Group IV semiconductor and the adjacent layer of silicon dioxide;
wherein the thickness of the reflector stack is no greater than 1 μm; the root mean square roughness of the interface formed by the layer of single-crystalline Group IV semiconductor and the layer of silicon dioxide of the first of the at least two adjacent layer pairs is no greater than 0.5 nm; and the root mean square roughness of the interface formed by the layer of single-crystalline Group IV semiconductor and the layer of silicon dioxide of the second of the at least two adjacent layer pairs is no greater than 0.5 nm;
an upper distributed Bragg reflector comprising:
a reflector stack comprising least two adjacent layer pairs, each layer pair comprising:
a layer of a single-crystalline Group IV semiconductor having a surface; and
an adjacent layer of silicon dioxide having a surface; wherein the surface of the layer of single-crystalline Group IV semiconductor and the surface of the adjacent layer of silicon dioxide form an interface between the layer of single-crystalline Group IV semiconductor and the adjacent layer of silicon dioxide;
wherein the thickness of the reflector stack is no greater than 1 μm; the root mean square roughness of the interface formed by the layer of single-crystalline Group IV semiconductor and the layer of silicon dioxide of the first of the at least two adjacent layer pairs is no greater than 0.5 nm; and the root mean square roughness of the interface formed by the layer of single-crystalline Group IV semiconductor and the layer of silicon dioxide of the second of the at least two adjacent layer pairs is no greater than 0.5 nm; and
a light-emitting active layer disposed between the lower distributed Bragg reflector and the upper distributed Bragg reflector.

18. The laser of claim 17, wherein the lower and upper distributed Bragg reflectors provide a reflectivity of at least 99.4% for light emitted by the active region in the wavelength range from 1300 nm to 1700 nm.

19. The laser of claim 17, wherein the innermost layer of single-crystalline Group IV semiconductor of the upper distributed Bragg reflectors is p-type doped to provide a p-type ohmic contact layer and the innermost layer of single-crystalline Group IV semiconductor of the lower distributed Bragg reflector is n-type doped to provide an n-type ohmic contact layer.

20. An array of vertical cavity surface emitting lasers comprising a plurality of the lasers of claim 17 on a substrate, wherein different vertical cavity light surface emitting lasers in the array are configured to emit light at different wavelengths when a voltage is applied across the vertical cavity surface emitting lasers.

21. The array of claim 20, wherein the single-crystalline Group IV semiconductor in some of the vertical cavity surface emitting lasers is silicon and the single-crystalline Group IV semiconductor in some of the vertical cavity surface emitting lasers is germanium.

22. The array of claim 20, wherein some of the vertical cavity surface emitting lasers are configured to emit light at a wavelength of 1.55 μm and some of the vertical cavity surface emitting lasers are configured to emit light at a wavelength of 0.98 μm.

23. The laser of claim 17, wherein the silicon dioxide of each layer pair is not a spin-on-glass type silicon oxide comprising mixtures of non-stoichiometric silicon oxides.

* * * * *